United States Patent
Balakrishnan et al.

(10) Patent No.: US 10,347,539 B2
(45) Date of Patent: * Jul. 9, 2019

(54) GERMANIUM DUAL-FIN FIELD EFFECT TRANSISTOR

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 15/967,845

(22) Filed: May 1, 2018

(65) Prior Publication Data

US 2018/0247873 A1  Aug. 30, 2018

Related U.S. Application Data

(60) Continuation of application No. 15/210,156, filed on Jul. 14, 2016, now Pat. No. 9,991,168, which is a
(Continued)

(51) Int. Cl.
*H01L 21/8234* (2006.01)
*H01L 29/165* (2006.01)
(Continued)

(52) U.S. Cl.
CPC .. *H01L 21/823431* (2013.01); *H01L 21/0337* (2013.01); *H01L 21/308* (2013.01); *H01L 21/76877* (2013.01); *H01L 21/823412* (2013.01); *H01L 21/823418* (2013.01); *H01L 29/0653* (2013.01); *H01L 29/0847* (2013.01); *H01L 29/161* (2013.01); *H01L 29/165* (2013.01); *H01L 29/41791* (2013.01); *H01L 29/42392* (2013.01); *H01L 29/66545* (2013.01);
(Continued)

(58) Field of Classification Search
CPC ..... H01L 21/823431; H01L 21/823418; H01L 29/165; H01L 29/0847; H01L 21/308; H01L 29/7848; H01L 21/823412; H01L 29/0653; H01L 27/41791; H01L 29/42392; H01L 29/785; H01L 21/0337; H01L 21/76877; H01L 29/161; H01L 29/66545; H01L 29/66795; H01L 2029/7858
USPC .......................................... 257/401
See application file for complete search history.

(56) References Cited

U.S. PATENT DOCUMENTS 6,888,199 B2  5/2005  Nowak et al.
6,953,726 B2  10/2005  Nowak et al.
(Continued)

FOREIGN PATENT DOCUMENTS

WO   2013095474 A1   6/2013

*Primary Examiner* — Hrayr A Sayadian
(74) *Attorney, Agent, or Firm* — Kristofer Haggerty

(57) ABSTRACT

In one example, a field effect transistor includes a pair of fins positioned in a spaced apart relation. Each of the fins includes germanium. Source and drain regions are formed on opposite ends of the pair of fins and include silicon. A gate is wrapped around the pair of fins, between the source and drain regions.

19 Claims, 14 Drawing Sheets

Related U.S. Application Data division of application No. 14/743,561, filed on Jun. 18, 2015, now Pat. No. 9,847,259, which is a continuation of application No. 14/729,464, filed on Jun. 3, 2015, now Pat. No. 9,818,647.

(51) Int. Cl.

| | | |
|---|---|---|
| *H01L 29/08* | (2006.01) | |
| *H01L 21/308* | (2006.01) | |
| *H01L 29/78* | (2006.01) | |
| *H01L 29/06* | (2006.01) | |
| *H01L 29/417* | (2006.01) | |
| *H01L 29/423* | (2006.01) | |
| *H01L 21/033* | (2006.01) | |
| *H01L 21/768* | (2006.01) | |
| *H01L 29/161* | (2006.01) | |
| *H01L 29/66* | (2006.01) | |

(52) U.S. Cl.
CPC ...... *H01L 29/66795* (2013.01); *H01L 29/785* (2013.01); *H01L 29/7848* (2013.01); *H01L 2029/7858* (2013.01)

(56) References Cited

U.S. PATENT DOCUMENTS

| | | |
|---|---|---|
| 7,176,530 B1 | 2/2007 | Bulucea et al. |
| 8,053,299 B2 | 11/2011 | Xu |
| 8,063,427 B2 | 11/2011 | Goarin |
| 8,076,721 B2 | 12/2011 | Tang et al. |
| 8,723,233 B2 | 5/2014 | Cohen et al. |
| 9,991,168 B2 * | 6/2018 | Balakrishnan ............ H01L 21/823431 |
| 2005/0104130 A1 | 5/2005 | Nowak et al. |
| 2007/0176253 A1 | 8/2007 | Wang et al. |
| 2009/0032183 A1 | 12/2009 | Basker et al. |
| 2012/0031921 A1 | 12/2012 | Van Dal et al. |
| 2015/0048430 A1 | 2/2015 | He et al. |

* cited by examiner

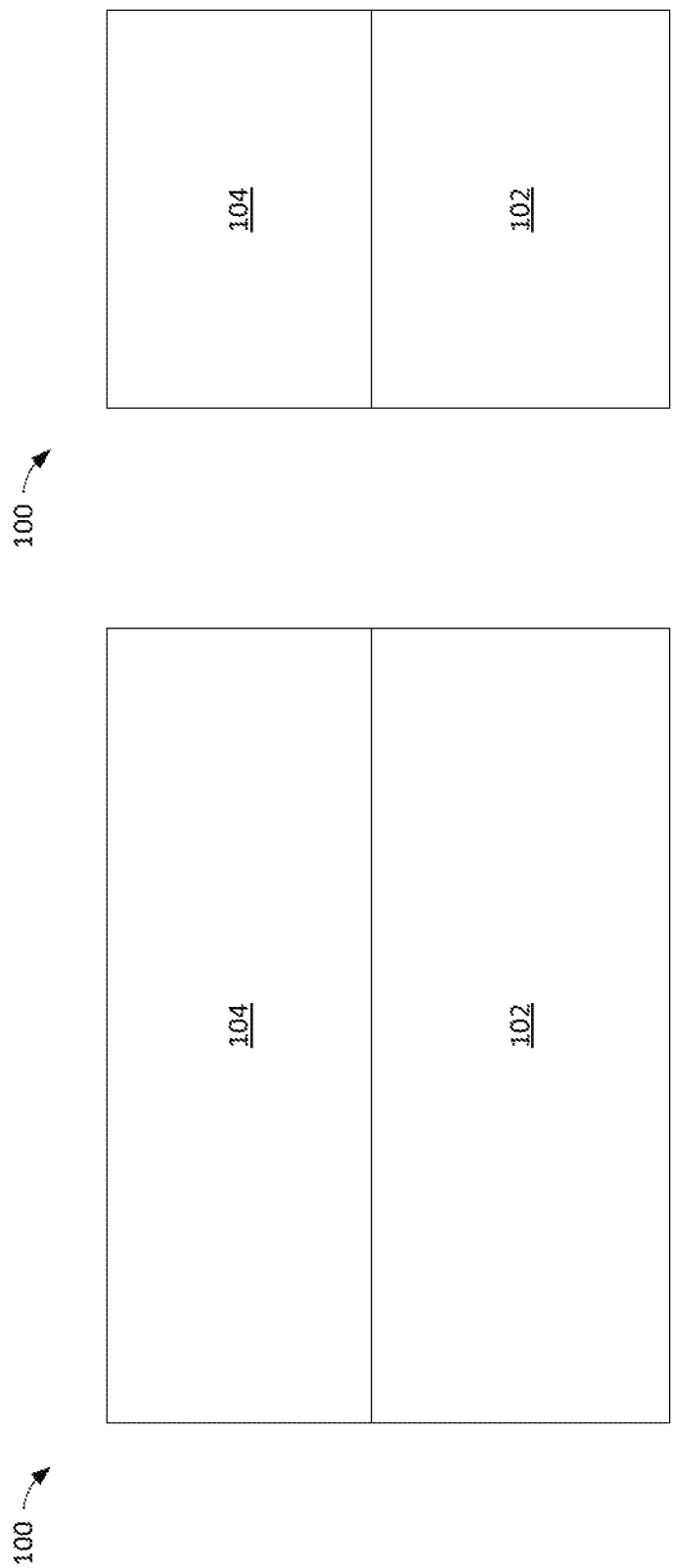

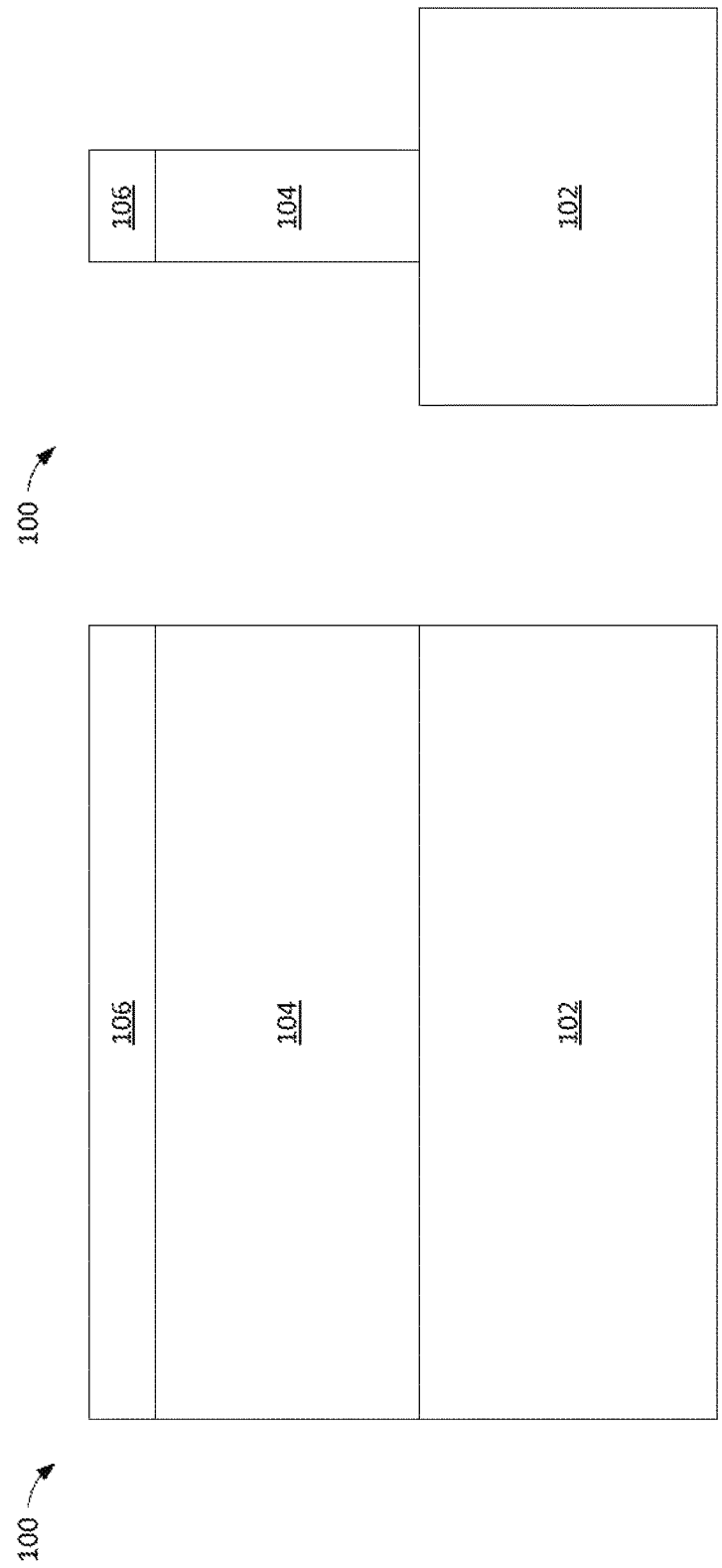

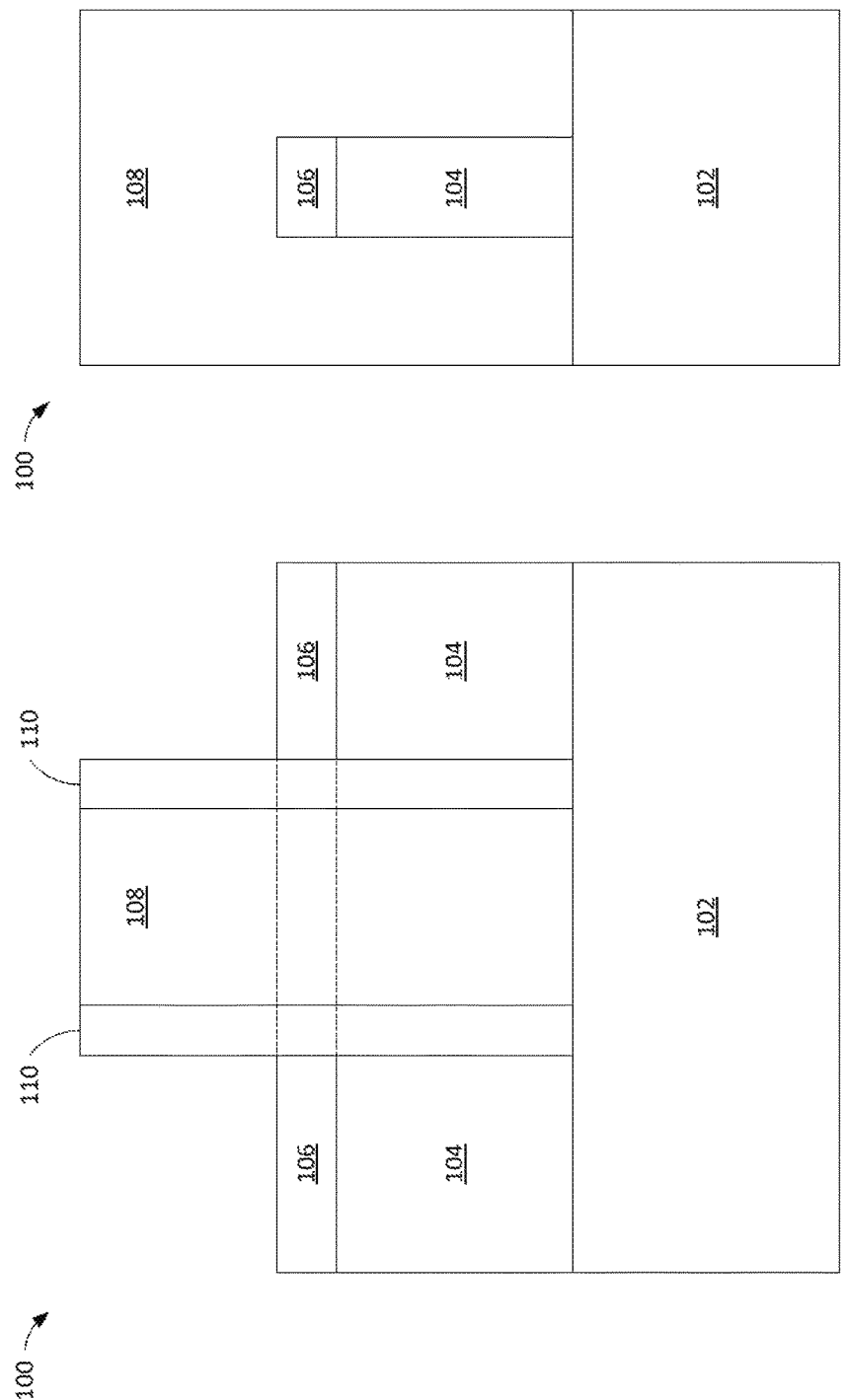

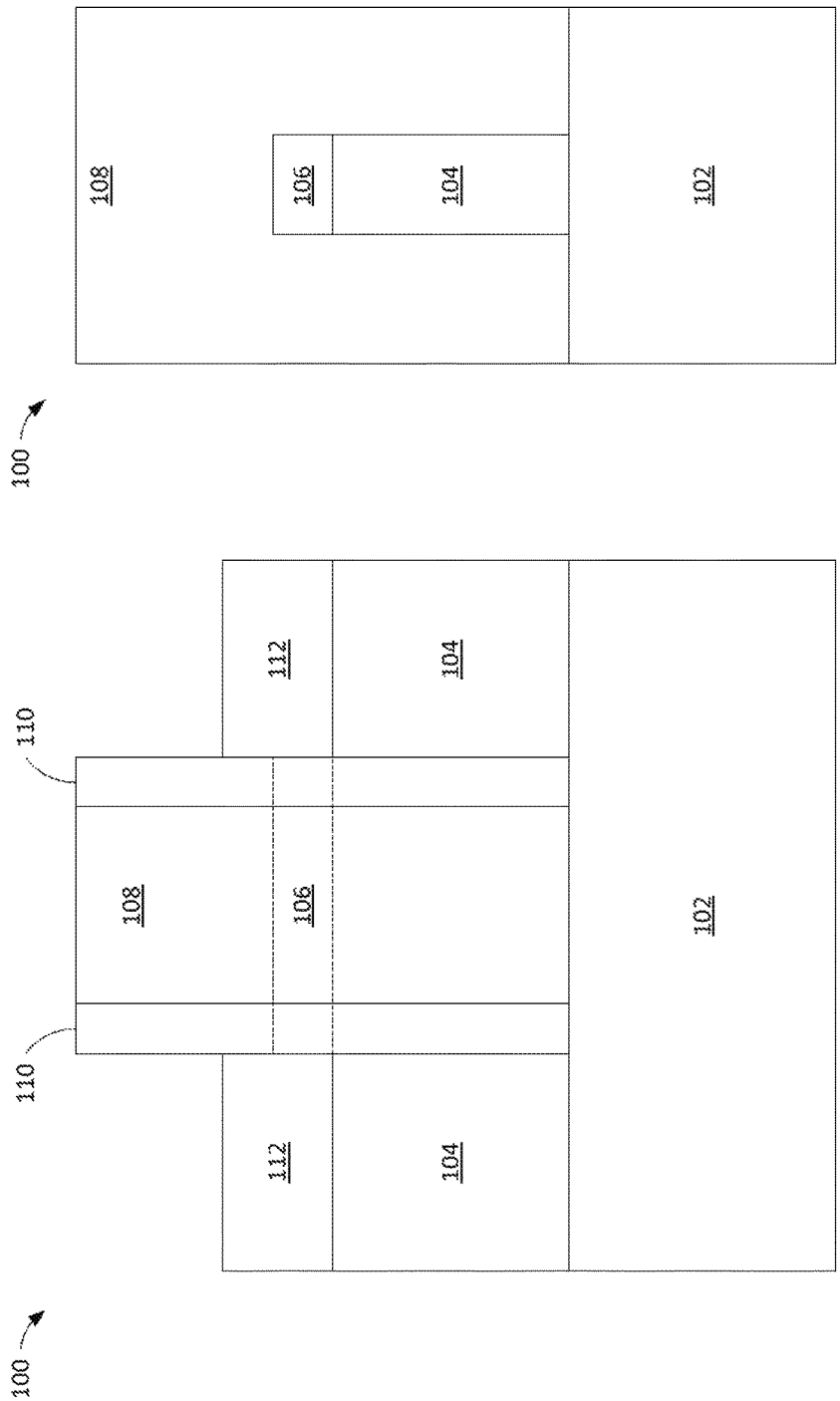

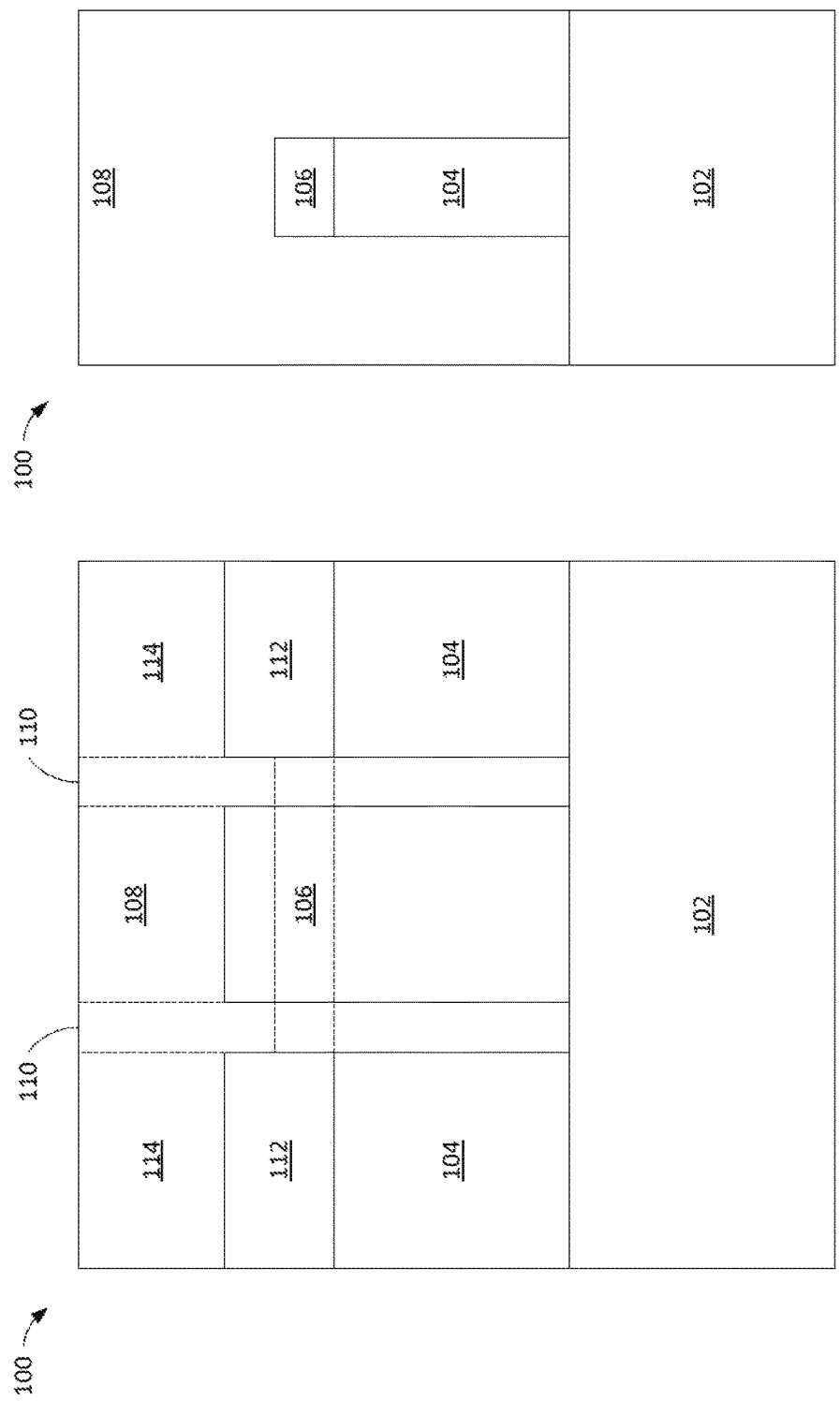

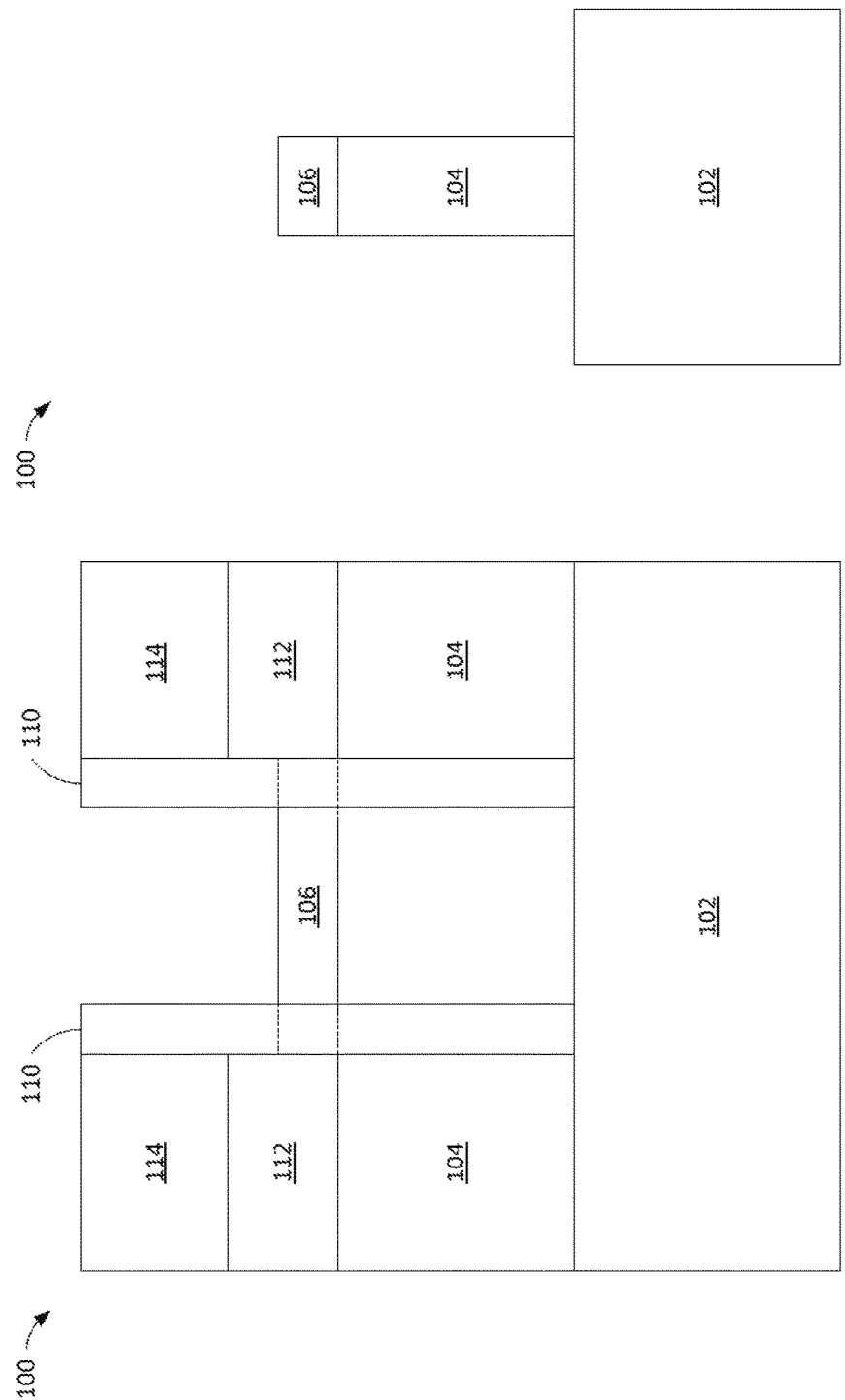

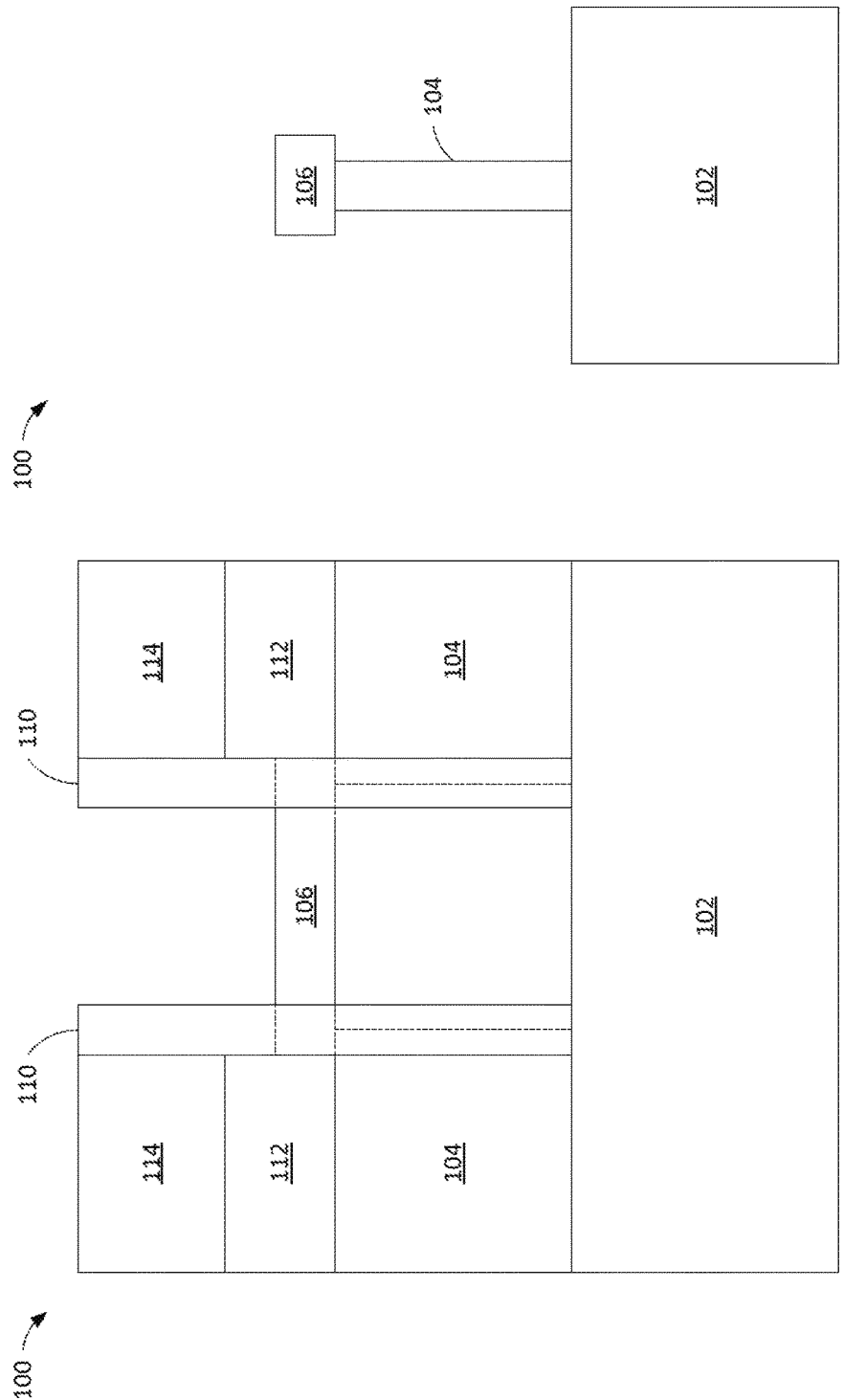

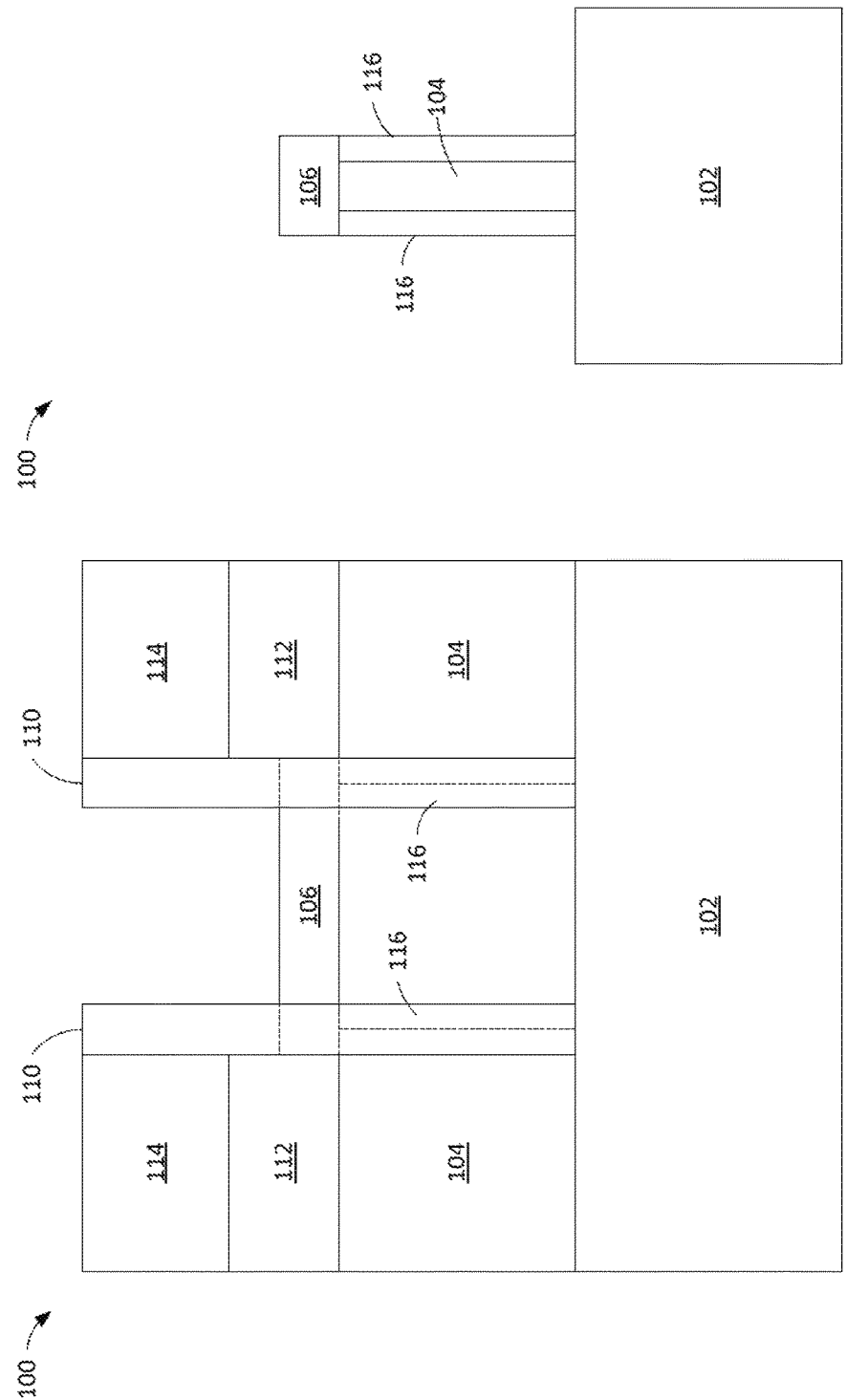

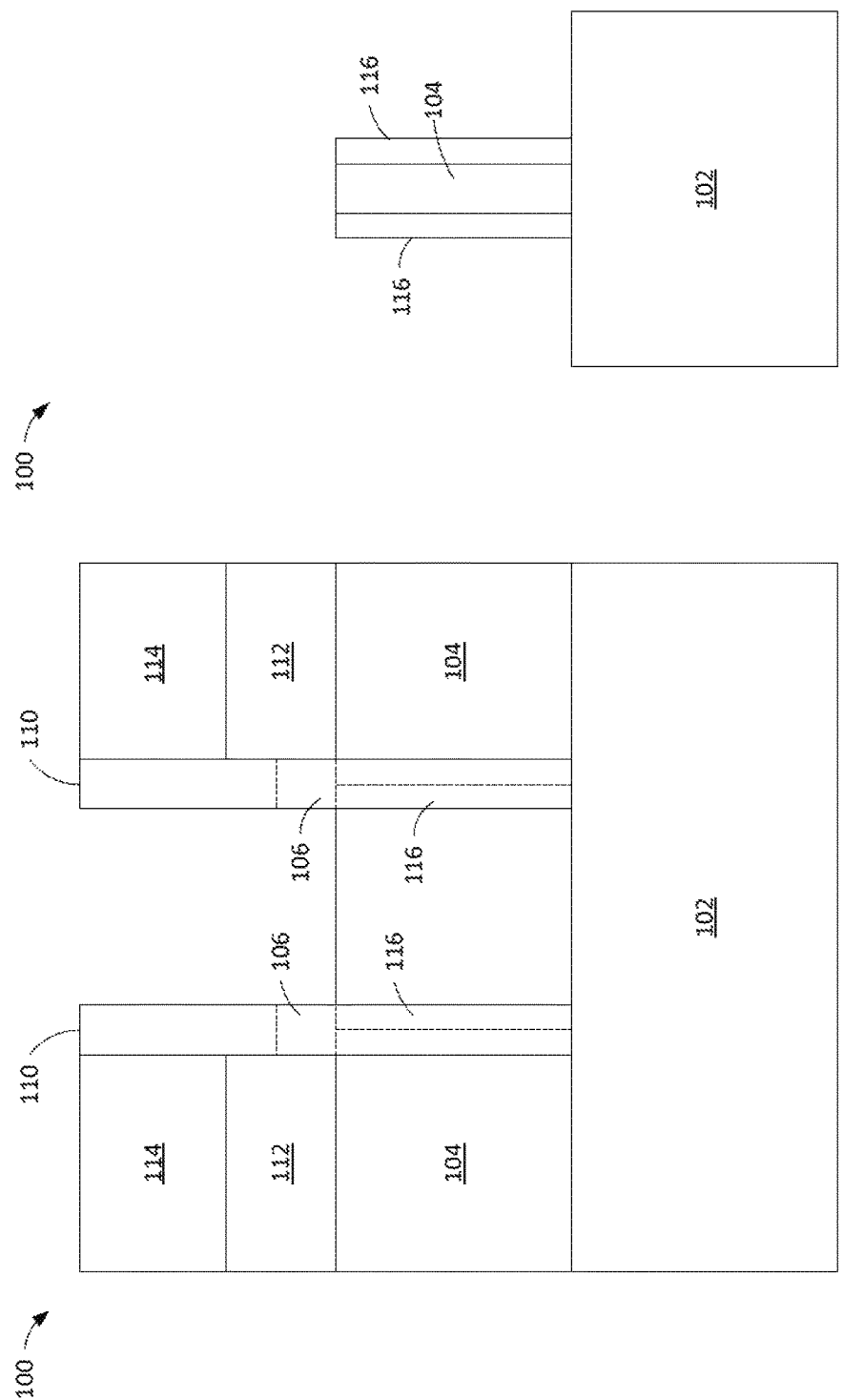

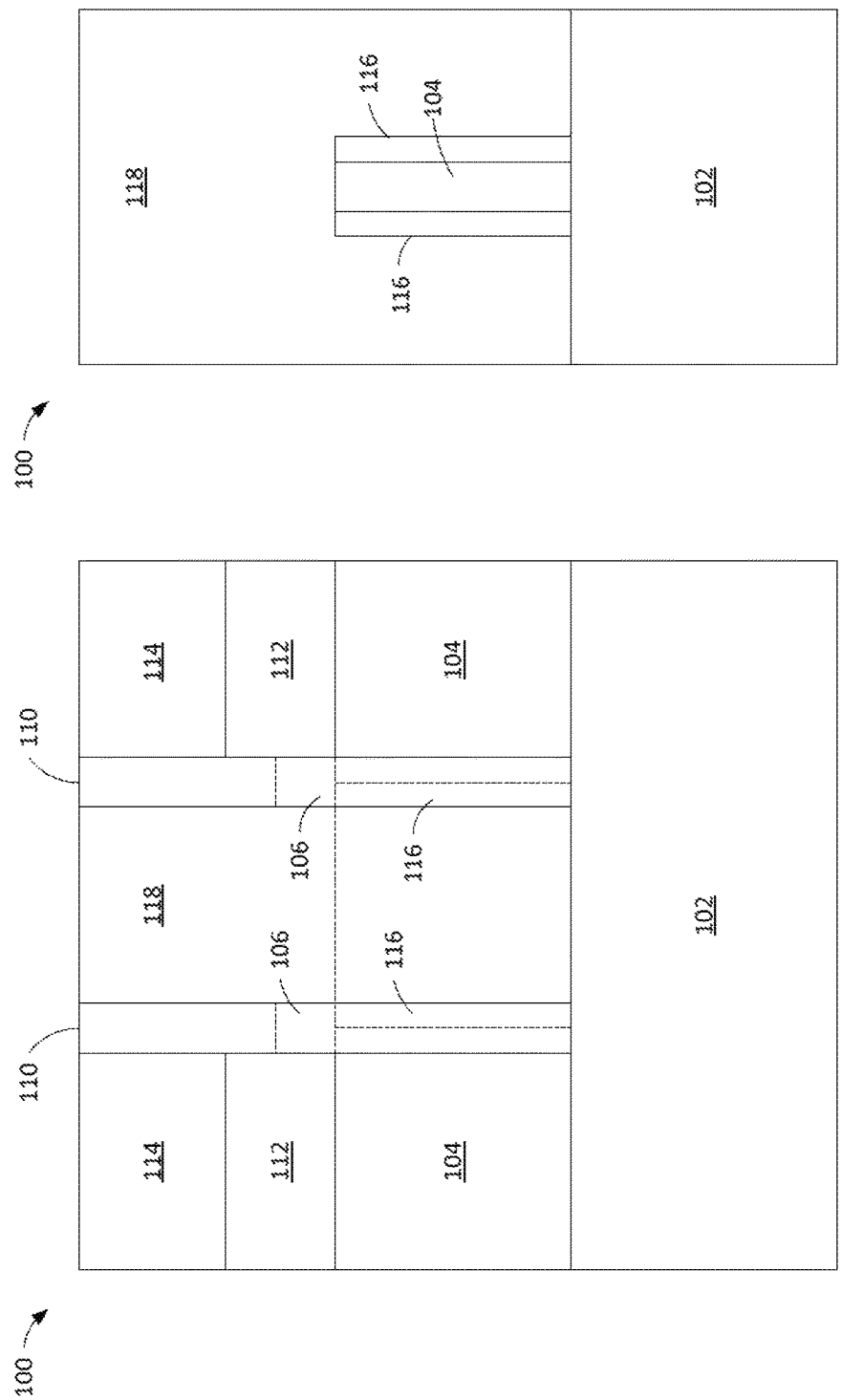

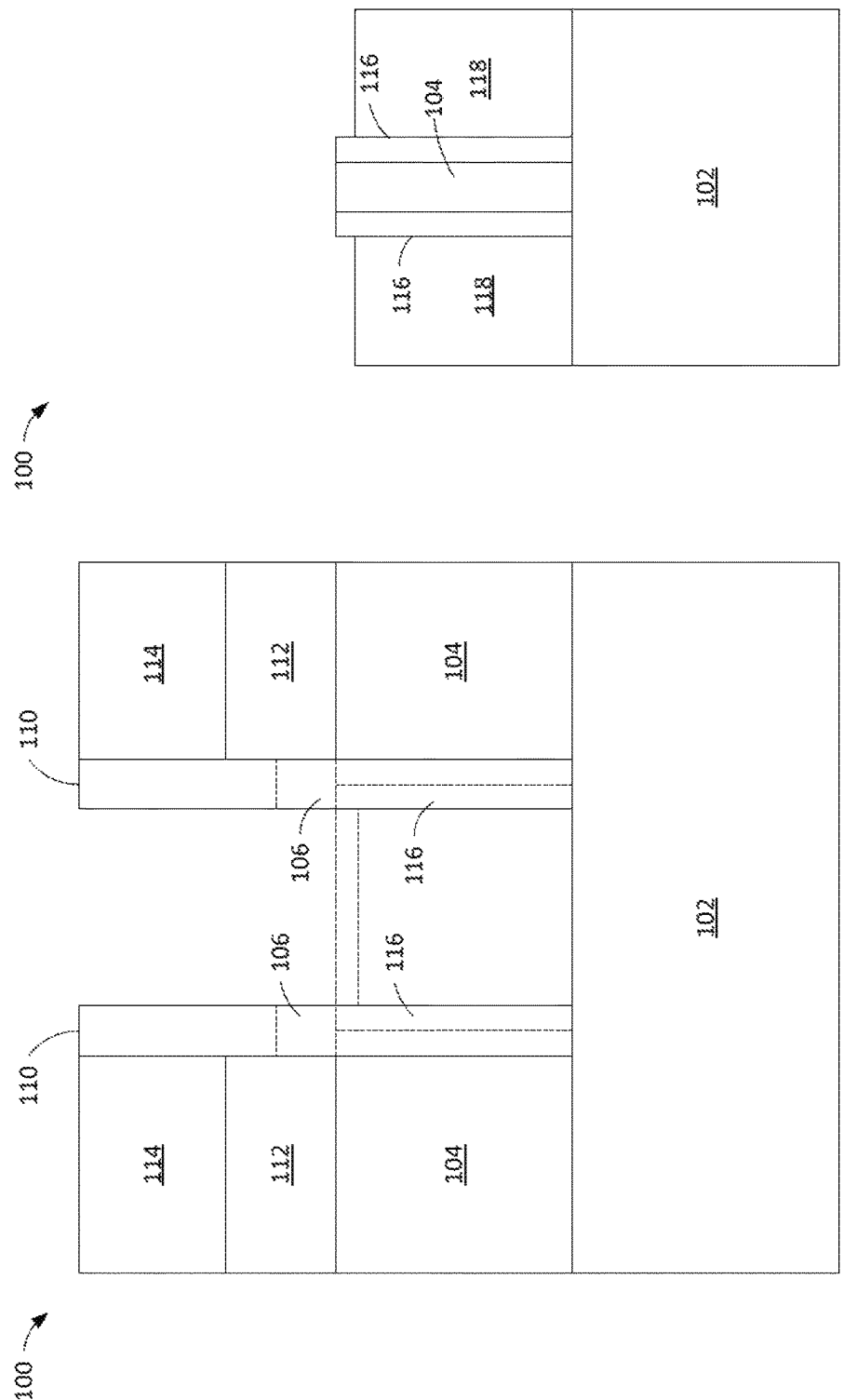

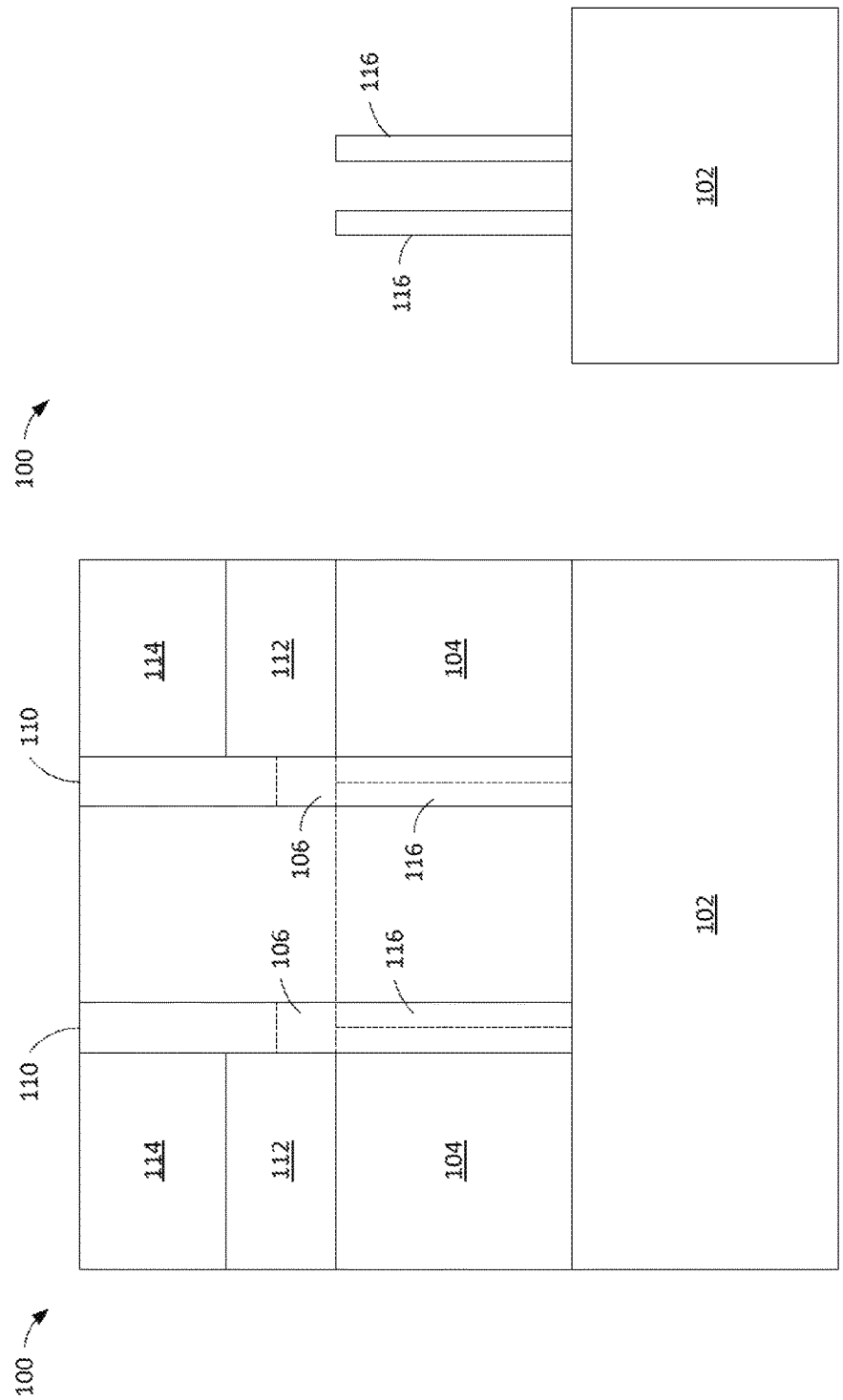

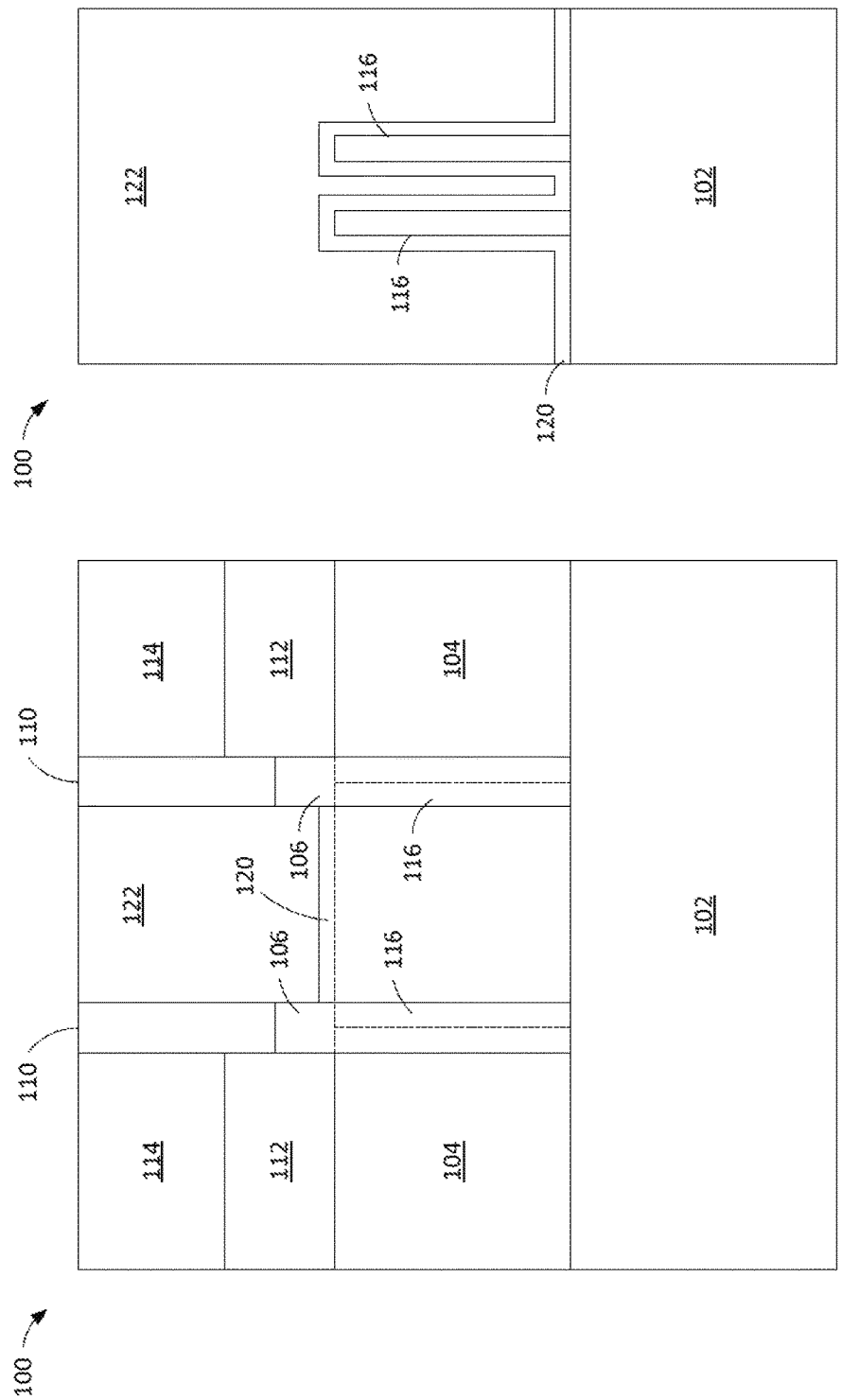

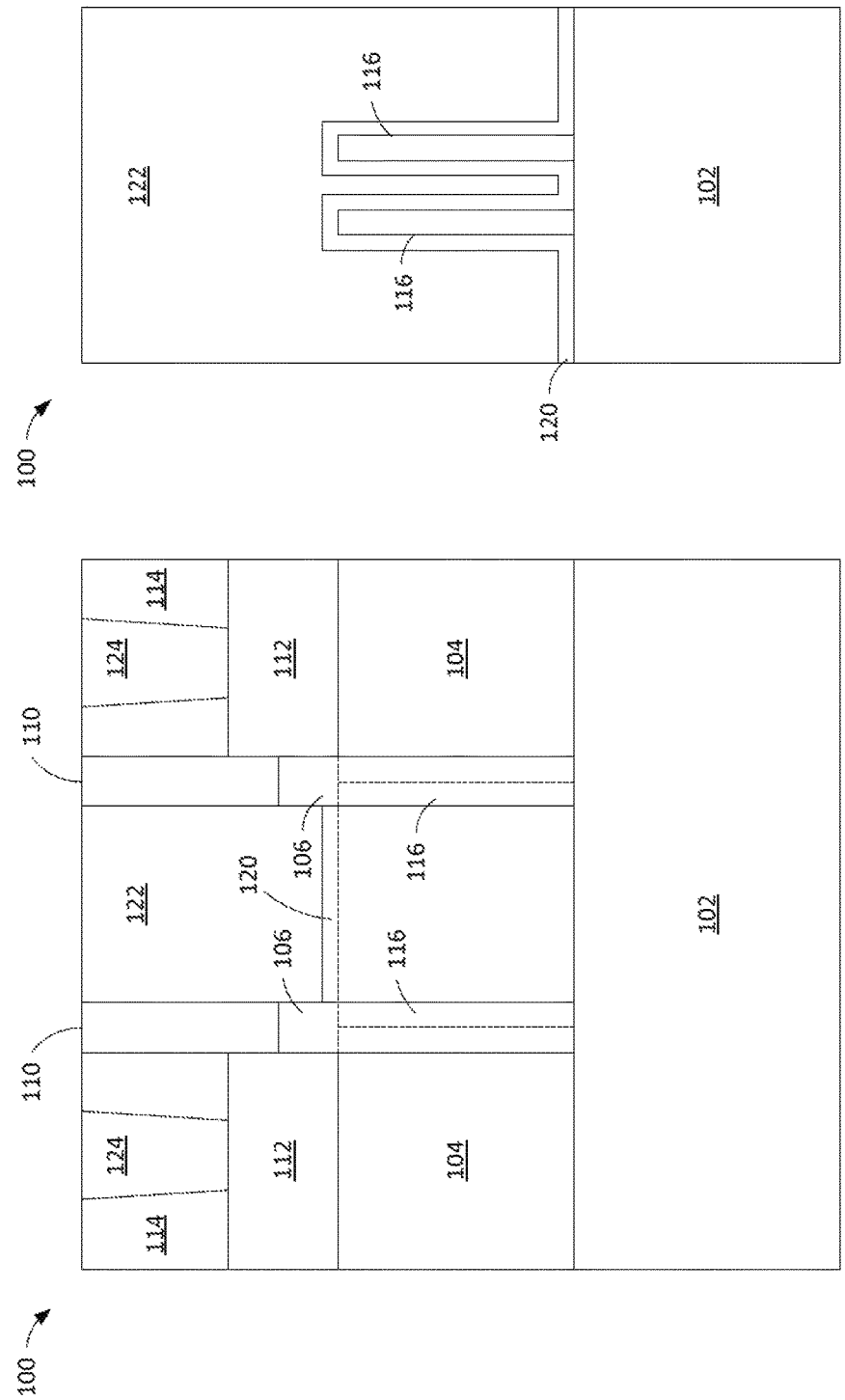

GERMANIUM DUAL-FIN FIELD EFFECT TRANSISTOR

FIELD OF THE DISCLOSURE

The present disclosure relates generally to semiconductor devices and relates more specifically to multiple gate field effect transistors.

BACKGROUND OF THE DISCLOSURE

Multiple gate field effect transistors (FETs) are metal-oxide-semiconductor field effect transistors (MOSFETs) that incorporate more than one gate into a single device. A finFET is a specific type of multiple gate FET in which the conducting channel is wrapped by a thin fin forming the body of the device. The effective channel length of the device in this case is determined by the thickness of the fin (measured from source to drain). The wrap-around structure of the gate provides improved electrical control over the channel, and thus helps mitigate leakage current and other short-channel effects.

SUMMARY OF THE DISCLOSURE

In one example, a field effect transistor includes a pair of fins positioned in a spaced apart relation. Each of the fins includes germanium. Source and drain regions are formed on opposite ends of the pair of fins and include silicon. A gate is wrapped around the pair of fins, between the source and drain regions.

In another example, a field effect transistor includes a pair of fins positioned in a spaced apart relation. Each of the fins includes a first semiconductor material. Source and drain regions are formed on opposite ends of the pair of fins and include a second semiconductor material different from the first semiconductor material. A gate is wrapped around the pair of fins, between the source and drain regions.

BRIEF DESCRIPTION OF THE DRAWINGS

The teachings of the present disclosure can be readily understood by considering the following detailed description in conjunction with the accompanying drawings, in which:

FIGS. 1A-1N illustrate side views of a field effect transistor during various stages of a fabrication process; and FIGS. 2A-2N illustrate corresponding front views of the field effect transistor of FIGS. 1A-1N during the various stages of the fabrication process.

To facilitate understanding, identical reference numerals have been used, where possible, to designate identical elements that are common to the Figures.

DETAILED DESCRIPTION

In one example, a germanium dual-fin field effect transistor is disclosed. In typical finFET devices, a single fin is formed from silicon. It has been shown, however, that silicon may not provide the best possible electron mobility. For instance, germanium has been experimentally and theoretically shown to offer higher electron mobility than silicon; however, germanium is also characterized by high external series resistance (e.g., as a result of high junction and contact resistances), which would limit device performance when implemented in a finFET.

Examples of the present disclosure provide a finFET including two fins formed from germanium and source/drain regions (and an extension) formed from doped silicon. A fabrication process for the disclosed finFET includes fabricating a "dummy" gate over a portion of an initial silicon fin, growing source and drain regions formed of doped silicon on either side of the dummy gate, and then removing the dummy gate. The initial silicon fin is then recessed below a hard mask so that a germanium channel can be grown on either side of the initial silicon fin's surface. The initial silicon fin is subsequently removed, so that the germanium channels ultimately form the fins of the device, thereby providing high electron mobility. At the same time, the doped silicon source/drain regions and extension provide low contact resistance. Overall, the device is characterized by very sharp junction resistance and low, silicon-dominated external series resistance. Although examples of the present disclosure are described within the context of N-type field effect transistors (NFETs), the processes described herein are also applicable to fabricating P-type field effect transistors (PFETs) with high hole mobility and low external series resistance.

FIGS. 1A-1N and FIGS. 2A-2N illustrate a field effect transistor 100 during various stages of a fabrication process performed according to examples of the present disclosure. As such, when viewed in sequence, FIGS. 1A-1N and FIGS. 2A-2N also serve as a flow diagram for the fabrication process. In particular, FIGS. 1A-1N illustrate side views (i.e., along the longer dimension of the fins) of the field effect transistor during various stages of the fabrication process, while FIGS. 2A-2N illustrate corresponding front views (i.e., along the shorter dimension of the fins) of the field effect transistor of FIGS. 1A-1N during the various stages of the fabrication process.

Referring simultaneously to FIG. 1A and FIG. 2A, the field effect transistor (FET) 100 begins as a substrate 102, formed, for example, from bulk silicon (Si) or silicon on insulator (SOI). An epitaxial layer 104 of doped silicon (e.g. $N^+$ doped silicon) is then grown on the substrate 102. In one example, the epitaxial layer 104 comprises $N^+$ doped silicon with a doping concentration of approximately 5e18 to 5e19 electrons per cubic centimeter. In one example, if the substrate 102 is formed from bulk silicon, then the surface of the epitaxial layer 104 is terminated with a polarity that is the opposite of the polarity of the FET being fabricated. Thus, if fabricating an NFET, the surface of the epitaxial layer 104 is $P^+$ doped; if fabricating a PFET, the surface of the epitaxial layer 104 is $N^+$ doped. The doping acts as a punch-through stopper to control leakage. For silicon on insulator substrates, the surface of the epitaxial layer 104 may be terminated with a layer of buried oxide.

As illustrated in FIG. 1B and FIG. 2B, a thin hard mask 106 is deposited over the epitaxial layer 104. The hard mask 106 may be formed, for example, from a high-K dielectric material. The epitaxial layer 104 is then patterned into a fin by removing a portion of the hard mask 106; thus, the reference numeral 104 is hereinafter used interchangeably to refer to both the epitaxial layer and to the fin that results from patterning of the epitaxial layer. In particular, the portion of the epitaxial layer 104 residing beneath the remaining part of the hard mask 106 forms a fin 104, as shown in FIG. 2B. In one example, the fin 104 is patterned to be wider than is typical for a finFET device. For instance, the width of the fin 104 may be approximately eighteen to twenty nanometers.

As illustrated in FIG. 1C and FIG. 2C, a dummy gate stack 108 is formed on the substrate 102 and wraps around a portion of the fin 104. The dummy gate stack 108 may be formed, for example, from poly silicon and silicon dioxide. In addition, spacers 110 are formed on either side of the dummy gate stack 108 and also wrap around the fin 104. The spacers 110 may be formed, for example, from a nitride, silicon oxide (SiOx), boron nitride (BN), silicon oxycarbonitride (SiCNO), or silicon carbonitride (SiCN).

As illustrated in FIG. 1D and FIG. 2D, the portion of the hard mask 106 residing over the source and drain regions of the fin 104 (i.e., the regions positioned on either side of the dummy gate stack 108) is next removed. Then, a doped silicon layer 112 (e.g., $N^{++}$ doped silicon) is grown over the source and drain regions of the fin 104, and the dopants are activated. Thus, the reference numeral 112 is hereinafter used interchangeably to refer to both the doped silicon layer 112 and to the source and drain regions formed by the doped silicon layer 112. In one example, the doped silicon that forms the source and drain regions 112 is $N^{++}$ doped with a doping concentration above approximately 1e20 electrons per cubic centimeter.

As illustrated in FIG. 1E and FIG. 2E, an inter-layer dielectric layer 114 is next formed over the source and drain regions 112 of the fin 104. The inter-layer dielectric layer 114 may be formed, for example, from silicon dioxide ($SiO_2$), a low-temperature oxide (LTO), a high-temperature oxide (HTO), or a flowable oxide (FOX). The inter-layer dielectric layer 114 may be planarized, for example using chemical mechanical polishing.

As illustrated in FIG. 1F and FIG. 2F, the dummy gate stack 108 is next removed, leaving the spacers 110. Removal of the dummy gate stack 108 leaves a channel between the source and drain regions 112, above the fin 104.

As illustrated in FIG. 1G and FIG. 2G, the fin 104 is next recessed. In particular, a portion of the fin 104 is removed under the edges of the hard mask 106, such that the fin 104 and the hard mask 106 collectively have a T-shaped profile (i.e., where the width of the hard mask 106 is greater than the width of the fin 104). The amount of recess sets an upper bound for the final widths of the dual fins that will be formed, as described in further detail below.

As illustrated in FIG. 1H and FIG. 2H, a germanium (Ge) layer 116 is next grown epitaxially around the fin 104, filling in the spaces that were recessed in FIGS. 1G and 2G. The germanium layer 116 can be grown at temperatures as low as approximately three hundred degrees Celsius with substantially no defects (i.e. no non-negligible defects). If the epitaxially grown germanium is non-uniform, the hard mask 106 can be used to etch the rest of the fin 104 (e.g., using reactive ion etching) so that the fin has substantially vertical sidewalls.

As illustrated in FIG. 1I and FIG. 2I, the hard mask 106 is next removed from the fin 104, so that the only remaining portions of the hard mask 106 reside below the spacers 110. For example, a selective reactive ion etch process may be used for the hard mask removal process.

As illustrated in FIG. 1J and FIG. 2J, the channel above the fin 104 is next filled with an organic planarizing layer (OPL) 118 or a flowable oxide. The OPL 118 is deposited directly over the fin 104.

As illustrated in FIG. 1K and FIG. 2K, the OPL 118 is next recessed to below the surface of the fin 104.

As illustrated in FIG. 1L and FIG. 2L, the fin 104 is next selectively etched with respect to the germanium layer 116 and to the OPL 118. Selective etching of the fin 104 in this context involves removing the portion of the fin 104 that resides between the germanium layer 116, but leaving at least some of the remainder of the fin 104. For instance, the portions of the fin 104 residing below the source and drain regions 112 are left substantially intact and become an extension of the source and drain regions 112. The OPL 118 is then stripped. The result is a pair of germanium fins spaced apart from each other in a parallel manner and formed on the substrate 102. Thus, the reference numeral 116 is hereinafter used interchangeably to refer to both the germanium layer 116 and to the pair of germanium fins formed by the germanium layer 116.

As illustrated in FIG. 1M and FIG. 2M, a high-k dielectric layer 120 is next deposited over the pair of germanium fins 116. A metal gate layer 122 is then deposited over the high-k dielectric layer 120. Deposition of the high-k dielectric layer 120 and the metal gate layer 122 may involve chemical mechanical polishing.

As illustrated in FIG. 1N and FIG. 2N, one or more contacts 124 are next formed in the inter-layer dielectric layer 114, down to the source and drain regions 112.

Thus, in the resultant field effect transistor 100, the gate 122 is wrapped around a pair of germanium fins 116 which form the main conducting channel. The source and drain regions 112 positioned at opposite ends of the conducting channel (and the extension formed beneath the source and drain regions 112) are formed from doped silicon (e.g., $N^{++}$ doped silicon and $N^+$ doped silicon, respectively). Thus, the fins 116 are formed from a different semiconductor material than the source and drain regions 112. The germanium of the fins 116 provides improved electron mobility (e.g., relative to silicon) in the channel, while the doped silicon of the source and drain regions 112 maintains the low (e.g., relative to germanium) external series resistance and contact resistance typical of silicon.

As discussed above, the process illustrated in FIGS. 1A-1N and 2A-2N may be adapted to fabricate a PFET having germanium dual fins. For example, referring back to FIGS. 1A and 2A, the epitaxial layer/fin 104 may instead be formed of $P^+$ doped silicon or $P^+$ doped silicon germanium (SiGe) with a low germanium content (e.g., less than approximately twenty percent germanium content), so that it can be selectively removed with respect to the germanium layer 116 that is subsequently deposited (e.g., as illustrated in FIGS. 1L and 2L). Additionally, the doped silicon layer/source and drain region 112 that is grown in FIGS. 1D and 2D will be $P^{++}$ doped rather than $N^{++}$ doped.

Although various embodiments which incorporate the teachings of the present invention have been shown and described in detail herein, those skilled in the art can readily devise many other varied embodiments that still incorporate these teachings.

What is claimed is:

1. A method, comprising:
    forming a fin on a substrate;
    forming a gate stack over a portion of the fin;
    growing source and drain regions over the fin, on both sides of the gate stack;
    removing the gate stack;
    epitaxially growing a pair of conducting channels on opposite sides of the fin, between the source and drain regions; and
    removing the fin from between the pair of conducting channels.

2. The method of claim 1, wherein the forming the fin comprises:
    growing an epitaxial layer of a semiconductor material on the substrate;
    patterning the epitaxial layer of semiconductor material using a hard mask, to form the fin.

3. The method of claim 1, wherein the fin is formed from N+ doped silicon.

4. The method of claim 3, wherein the growing the source and drain regions comprises:
depositing N++ doped silicon over the fin.

5. The method of claim 4, wherein a doping concentration of the N+ doped silicon is between approximately 5e18 and 5e19 electrons per cubic centimeter, and a doping concentration of N++ doped silicon is above approximately 1e20 electrons per cubic centimeter.

6. The method of claim 1, further comprising:
depositing a hard mask over the fin, prior to forming the gate stack;
recessing the fin under edges of the hard mask, prior to epitaxially growing the pair of conducting channels, such that the fin and the hard mask collectively form a T-shaped profile; and
removing the hard mask from the fin, subsequent to epitaxially growing the pair of conducting channels.

7. The method of claim 6, further comprising:
depositing an organic planarizing layer or a flowable oxide above the fin, subsequent to removing the hard mask; and
removing the organic planarizing layer or flowable oxide, subsequent to removing the fin.

8. The method of claim 1, further comprising:
depositing an inter-layer dielectric material over the source and drain regions; and
forming at least one contact in the inter-layer dielectric material, down to the source and drain regions.

9. The method of claim 1, further comprising:
depositing a high-k dielectric material over the pair of conducting fins; and
depositing a gate over the high-k dielectric material.

10. The method of claim 1, wherein the pair of conducting channels is formed of germanium.

11. The method of claim 1, wherein the pair of conducting channels and the source and drain regions comprise portions of a field effect transistor.

12. The method of claim 1, wherein the source and drain regions are formed from a first material, and the pair of conducting channels is formed from a second material that is different from the first material.

13. A method, comprising:
fabricating a dummy structure
growing source and drain regions on opposite sides of the dummy structure;
removing a portion of the dummy structure after growing the source and drain regions;
epitaxially growing a pair of conducting channels in place of the portion of the dummy structure that was removed; and
removing a remainder of the dummy structure from between the pair of conducting channels.

14. The method of claim 13, wherein the source and drain regions are formed from a first material, and the pair of conducting channels is formed from a second material that is different from the first material.

15. The method of claim 14, wherein the first material is doped silicon.

16. The method of claim 14, wherein the second material is germanium.

17. The method of claim 13, wherein the pair of conducting channels and the source and drain regions comprise portions of a field effect transistor.

18. The method of claim 13, further comprising:
depositing an inter-layer dielectric material over the source and drain regions; and
forming at least one contact in the inter-layer dielectric material, down to the source and drain regions.

19. The method of claim 13, further comprising:
depositing a high-k dielectric material over the pair of conducting fins; and
depositing a gate over the high-k dielectric material.

* * * * *